United States Patent
Cortes Mayol et al.

(10) Patent No.: US 10,930,777 B2
(45) Date of Patent: Feb. 23, 2021

(54) LATERALLY DOUBLE DIFFUSED METAL OXIDE SEMICONDUCTOR (LDMOS) DEVICE ON FULLY DEPLETED SILICON ON INSULATOR (FDSOI) ENABLING HIGH INPUT VOLTAGE

(71) Applicant: GLOBALFOUNDRIES INC., Grand Cayman (KY)

(72) Inventors: Ignasi Cortes Mayol, Dresden (DE); Alban Zaka, Dresden (DE); Tom Herrmann, Dresden (DE); El Mehdi Bazizi, Saratoga Springs, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 15/819,825

(22) Filed: Nov. 21, 2017

(65) Prior Publication Data
US 2019/0157451 A1    May 23, 2019

(51) Int. Cl.
*H01L 29/08*    (2006.01)
*H01L 29/423*   (2006.01)
(Continued)

(52) U.S. Cl.
CPC ...... *H01L 29/7824* (2013.01); *H01L 29/0873* (2013.01); *H01L 29/0886* (2013.01);
(Continued)

(58) Field of Classification Search
CPC ............. H01L 29/7824; H01L 29/0873; H01L 29/0886; H01L 29/42376; H01L 29/66681
See application file for complete search history.

(56) References Cited

U.S. PATENT DOCUMENTS 5,289,030 A * 2/1994 Yamazaki ......... H01L 21/76897
257/410
9,793,394 B1  10/2017 Zhu et al.
(Continued)

FOREIGN PATENT DOCUMENTS

TW     201203515    1/2012
WO    2012161859   11/2012

OTHER PUBLICATIONS

Li et al., "A High Speed and Power-Efficient Level Shifter for High Voltage Buck Converter Drivers", IEEE, 2010, 3 pages.
(Continued)

*Primary Examiner* — Matthew C Landau
*Assistant Examiner* — Mark Hatzilambrou
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to an LDMOS device on FDSOI structures and methods of manufacture. The laterally double diffused semiconductor device includes a gate dielectric composed of a buried insulator material of a semiconductor on insulator (SOI) technology, a channel region composed of semiconductor material of the SOI technology and source/drain regions on a front side of the buried insulator material such that a gate is formed on a back side of the buried insulator material. The gate terminal can also be placed at a hybrid section used as a back-gate voltage to control the channel and the drift region of the device.

20 Claims, 4 Drawing Sheets

(51) Int. Cl.
*H01L 29/786* (2006.01)
*H01L 29/78* (2006.01)
*H01L 29/66* (2006.01)
*H01L 29/40* (2006.01)

(52) U.S. Cl.
CPC ...... *H01L 29/402* (2013.01); *H01L 29/42364* (2013.01); *H01L 29/42372* (2013.01); *H01L 29/42376* (2013.01); *H01L 29/66681* (2013.01); *H01L 29/78624* (2013.01)

(56) References Cited

U.S. PATENT DOCUMENTS

| | | |
|---|---|---|
| 2008/0290408 A1 | 11/2008 | Hsu et al. |
| 2009/0267151 A1* | 10/2009 | Ohnuma ........... H01L 29/41783 257/347 |
| 2011/0227159 A1 | 9/2011 | Chan et al. |
| 2015/0116029 A1* | 4/2015 | Litty ................... H01L 29/1079 327/534 |
| 2016/0211367 A1 | 7/2016 | Ito et al. |

OTHER PUBLICATIONS

Kim et al., "High Voltage Power Integrated Circuit Technology Using SOI for Driving Plasma Display Panels", IEEE Trans on Electron Devices, vol. 48, No. 6, Jun. 2001, 8 pages.

Liang et al., "A 200-V SOI p-Channel LDMOS with thick gate oxide layer", IEEE International Nanoelectronics Conference (INEC), 2016, 2 pages.

Sŏnský et al., "Towards universal and voltage-scalable high gate- and drain-voltage MOSFETs in CMOS", IEEE, 2009, 4 pages.

German Office Action in related DE Application No. 10 2018 202 836.2 dated Nov. 14, 2018, 27 pages.

Taiwanese Office Action and Search Report in related TW Application No. 107124523 dated Dec. 5, 2018, 6 pages.

Taiwanese Office Action and Search Report in related TW Application No. 107124523 dated Jun. 6, 2019, 6 pages.

Taiwanese Office Action and Search Report in related TW Application No. 107124523 dated Dec. 11, 2019, 12 pages.

Taiwanese Notice of Allowance in related TW Application No. 107124523 dated Jun. 11, 2020, 4 pages.

* cited by examiner

LATERALLY DOUBLE DIFFUSED METAL OXIDE SEMICONDUCTOR (LDMOS) DEVICE ON FULLY DEPLETED SILICON ON INSULATOR (FDSOI) ENABLING HIGH INPUT VOLTAGE

FIELD OF THE INVENTION

The present disclosure relates to semiconductor structures and, more particularly, to an LDMOS device on FDSOI substrate able to sustain high input voltage and methods of manufacture.

BACKGROUND

To accommodate increasing numbers of high voltage signal chip DC/DC converters, e.g. automotive electronics or MEMS applications, different processes suitable for power ICs featuring thin/thick gate oxides and devices with higher voltage ratings are required. High gate voltage capability is essential to realize the required functionality in many application circuits such as display drivers or embedded flash memory driving circuits Laterally double diffused metal oxide semiconductor (LDMOS) devices are commonly employed as power switches due to their compatibility with low-voltage CMOS in the same chip. However, in order to drive the high side power switch, the gate oxide of the LDMOS must be thick enough to support the high gate-source (Vgs) voltage, which is not possible with current fully depleted silicon on insulator (FDSOI) technology. That is, there is no known high voltage (HV) LDMOS device in FDSOI able to sustain high Vgs and have a low switching time. For example, current FDSOI LDMOS devices for 5V applications allows typically Vgs voltages in the range of 1.8V.

SUMMARY

In an aspect of the disclosure, a laterally double diffused semiconductor device comprises a gate dielectric composed of a buried insulator material of a semiconductor on insulator (SOI) technology, a channel region composed of semiconductor material of the SOI technology and source/drain regions on a front side of the buried insulator material.

In an aspect of the disclosure, a structure comprises: a substrate composed of at least one well structure; a buried oxide (BOX) layer over the substrate, the buried oxide layer being a gate dielectric material of a transistor of a laterally double diffused semiconductor device; a semiconductor on insulator material over the buried oxide layer, the semiconductor on insulator material being a channel region of the transistor; and source and drain regions with respective contacts provided above the buried oxide layer such that a gate is formed on a back side of the buried insulator material. A gate terminal is placed at a hybrid section is used as a back-gate voltage to control the channel and the drift region of the transistor.

In an aspect of the disclosure, a method comprises: patterning a buried insulator material of a semiconductor on insulator (SOI) technology to be a gate dielectric of a laterally double diffused semiconductor device; patterning a semiconductor material of the SOI technology to be a channel region of the laterally double diffused semiconductor device; forming a well under the buried insulator material; forming source/drain regions on a front side of the buried insulator material; and epitaxially growing contacts on the source/drain regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an LDMOS device on FDSOI structures and methods of manufacture. More specifically, the present disclosure describes an N-LDMOS or P-LDMOS device on FDSOI, which uses the buried insulator layer (e.g., buried oxide layer) as a gate dielectric material. Advantageously, by implementing the structures described herein, the LDMOS device is capable of sustaining high input voltage, e.g., high Vgs of 15 V or greater, while also exhibiting a low switching time.

The LDMOS structures of the present disclosure can be manufactured in a number of ways using a number of different tools. In general, though, the methodologies and tools are used to form structures with dimensions in the micrometer and nanometer scale. The methodologies, i.e., technologies, employed to manufacture the LDMOS structures of the present disclosure have been adopted from integrated circuit (IC) technology. For example, the structures are built on wafers and are realized in films of material patterned by photolithographic processes on the top of a wafer. In particular, the fabrication of the LDMOS structures uses three basic building blocks: (i) deposition of thin films of material on a substrate, (ii) applying a patterned mask on top of the films by photolithographic imaging, and (iii) etching the films selectively to the mask.

Figure 1:
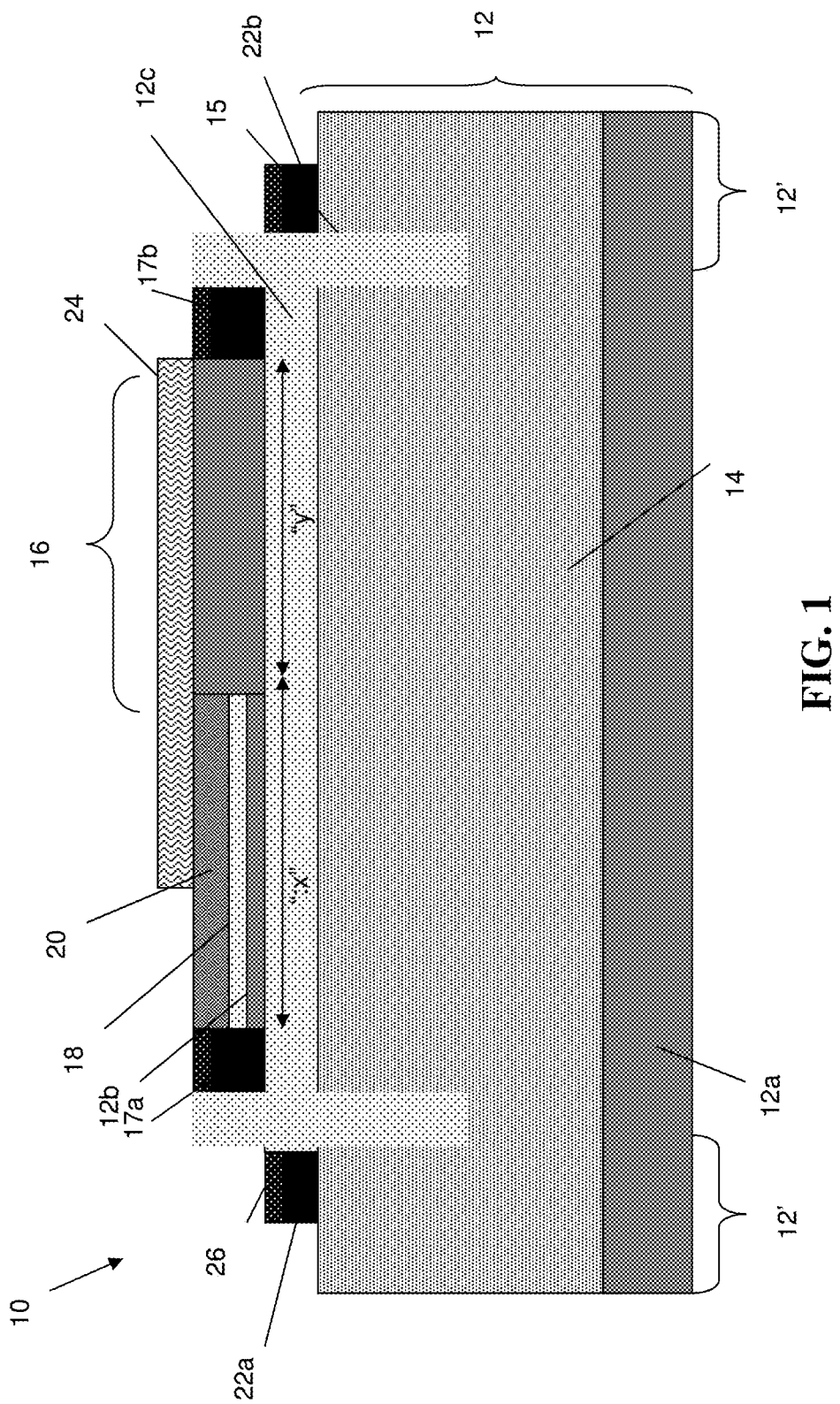
FIG. 1 shows a cross-sectional view of an FDSOI LDMOS structure with an N-well and respective fabrication processes in accordance with aspects of the present disclosure.

FIG. 1 shows a cross-sectional view of an FDSOI LDMOS structure with an N-well in accordance with aspects of the present disclosure. In particular, the FDSOI LDMOS structure 10 includes a silicon-on-insulator substrate 12, e.g., P-substrate 12a, silicon on insulator layer 12b and a buried insulator (oxide) layer (BOX) 12c. In embodiments, the BOX layer 12c is used as a gate oxide, enabling Vgs up to about 15V, while also reducing gate related parasitics. The layer 12b can be any suitable substrate material including, but not limited to, Si, SiGe, SiGeC, SiC, GE alloys, GaAs, InAs, InP, and other III/V or II/VI compound semiconductors.

Still referring to FIG. 1, the layer 12b and the buried oxide layer (BOX) 12c are patterned (opened) to open a window for a hybrid section 12'. In embodiments, the patterning of the layers 12b, 12c can be used for form different gate lengths "x". For example, the gate length can be about 500 nm, as one non-limiting illustrative example. The buried oxide layer 12c can be a thick layer of oxide, e.g., on the order of 20 nm. In embodiments, the buried oxide layer 12c is used as a gate oxide, which will substantially reduce gate related parasitics, while also enabling high Vgs, e.g., 15V and greater.

In embodiments, the patterning of the layers 12b, 12c is performed by conventional CMOS processes, e.g., lithography and etching processes. By way of example, a resist formed over the layer 12b is exposed to energy (light) to form a pattern (opening). An etching process with a selective chemistry, e.g., RIE, will be used to remove portions of the layers 12b, 12c through the openings of the resist. In embodiments, before well implants, the BOX-SOI can be etched to form the hybrid section 12', which is then defined by shallow trench isolation structure (STI) regions 15 partially covering the hybrid section (to separate the SOI section with the hybrid section).

The STI regions 15 can be formed by conventional lithography, etching and deposition methods. By way of example, following an etching process to form a trench in the substrate 12a, an oxide material can be deposited using any conventional deposition method, e.g., chemical vapor deposition (CVD), followed by removal of any residual oxide material. The residual oxide material can be removed from the surface of the structure using a conventional chemical mechanical polishing (CMP) process. The hybrid section 12' will be provided on the sides of the STI regions 15, as shown in FIG. 1.

An N-well implant region 14 is formed in the substrate 12a. In embodiments, the N-well implant region 14 is used to propagate the back-gate voltage, with the N-well region being isolated to avoid cross-talk. For example, STI regions 15 can be formed in the substrate 12a, for the isolation of the N-well implant region 14. In embodiments, the STI regions 15 are formed partially through the thickness of the N-well implant region 14.

In embodiments, the N-well implant region 14 can be fabricated using conventional doping or ion implantation processes. For example, in embodiments, the N-well implant region 14 can be provided by a blanket implant process, as is known by those of ordinary skill in the art. As an example, to fabricate the N-well implant region 14, arsenic can be implanted at a low implantation level in the layer 12b (channel region) and phosphorous (for P-type wells, Boron, Indium or $BF_2$ can be used) can be implanted at a higher implantation level in the wafer (e.g., substrate 12a) using appropriate energy and doping concentrations for logic devices, followed by an annealing process as is known in the art. In alternative embodiments, the channel region can be implanted with $BF_2$ at a low energy level, e.g., 6 keV. It should be understood by those of ordinary skill in the art that the implant dosage and energy can be adjusted based on a desired Vt level of the logic device.

In more specific embodiments, the Wells (N-well) are first implanted in the device area (Hybrid+SOI). In embodiments, a mask can be used to define the well region. Second, after the N-well, an additional implant (using the same N-well mask) is performed with low energy $BF_2$ to dope the SOI layer 12b. This implant will adjust the threshold voltage of the device and to have better gate-control.

FIG. 1 further shows a gate oxide layer 18 formed on a portion of the layer 12b. In embodiments, the gate oxide layer 18 can be a thermally grown oxide material. Following the formation of the gate oxide layer 18, P and N spacers 20 are formed on the gate oxide layer 18. Note that a poly deposition used in conventional build structures is no longer required in accordance with the methods described herein; instead, the layer 12b will be the active layer of the channel region of the gate structure.

In embodiments, the P and N spacers 20 can be nitride material deposited using any conventional deposition method, e.g., chemical vapor deposition (CVD) or plasma enhanced CVD (PECVD) processes. The gate oxide layer 18 and the spacers 20 can be patterned using conventional lithography and etching (e.g., RIE) to form a gate stack as should be understood by those of ordinary skill in the art.

Still referring to FIG. 1, an extended drain region 16 (e.g., drift region) is formed on the layer 12b, between the N+ drain contact 17b and the gate oxide material 18. In embodiments, the drift region 16 will increase the drain voltage capability. To reduce the Ron resistance, an optional epitaxially growth is provided in the drift region 16 to define a thicker silicon material in this region. For example, in embodiments, the extended drain region 16 can be formed by an epitaxial growth of semiconductor material, preferably to further increase the thickness (e.g., 5 nm to 20 nm silicon additional thickness). The extended drain region 16 can be lightly doped with any appropriate implant, e.g., doped with masked implants using, e.g., phosphorous at low energy and dosage (e.g., 6 keV, 5e13). The optional extended drain region 16 can have a length "y" of about 150 nm, although other dimensions are also contemplated herein depending on the desired electrical characteristics.

The source contact 17a and the drain contact 17b can be grown on the source region and drain region, respectively, of the device. In particular, the source contact 17a and the drain contact 17b can be epitaxially grown on the semiconductor material 12b, as an example. Gate contacts 22a and 22b can also be grown in the same processes with the source contact 17a and the drain contact 17b, on the substrate material 12a. In embodiments, the source contact 17a, the drain contact 17b and the gate contacts 22a, 22b are N+ type epi materials. Prior to the growth process, any exposed semiconductor material, e.g., material that forms the extended drain region 16, will be masked with a masking material 24, e.g., hardmask material, to ensure that epi material is confined to growing on the source/drain regions and the gate contact regions. In embodiments, the gate contacts 22a, 22b (e.g., gate terminals) could be defined on one side or both sides of the device, e.g., transistor. The gate terminals 22a, 22b at hybrid section 12' can be used as back-gate voltage. Also, the gate (which is on the backside of the BOX layer 12c) will control the channel (e.g., the active layer (layer 12b) and the drift region (e.g., extended drain region 16) at the same time.

A silicide 26 is formed on the contacts 17a, 17b, 22a, 22b. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 26 in the active regions of the device. In embodiments, the gate terminal, e.g., gate contact 22b, placed at the hybrid section 12' is used as a back-gate voltage to control the channel and the drift region of the device.

Figure 2:
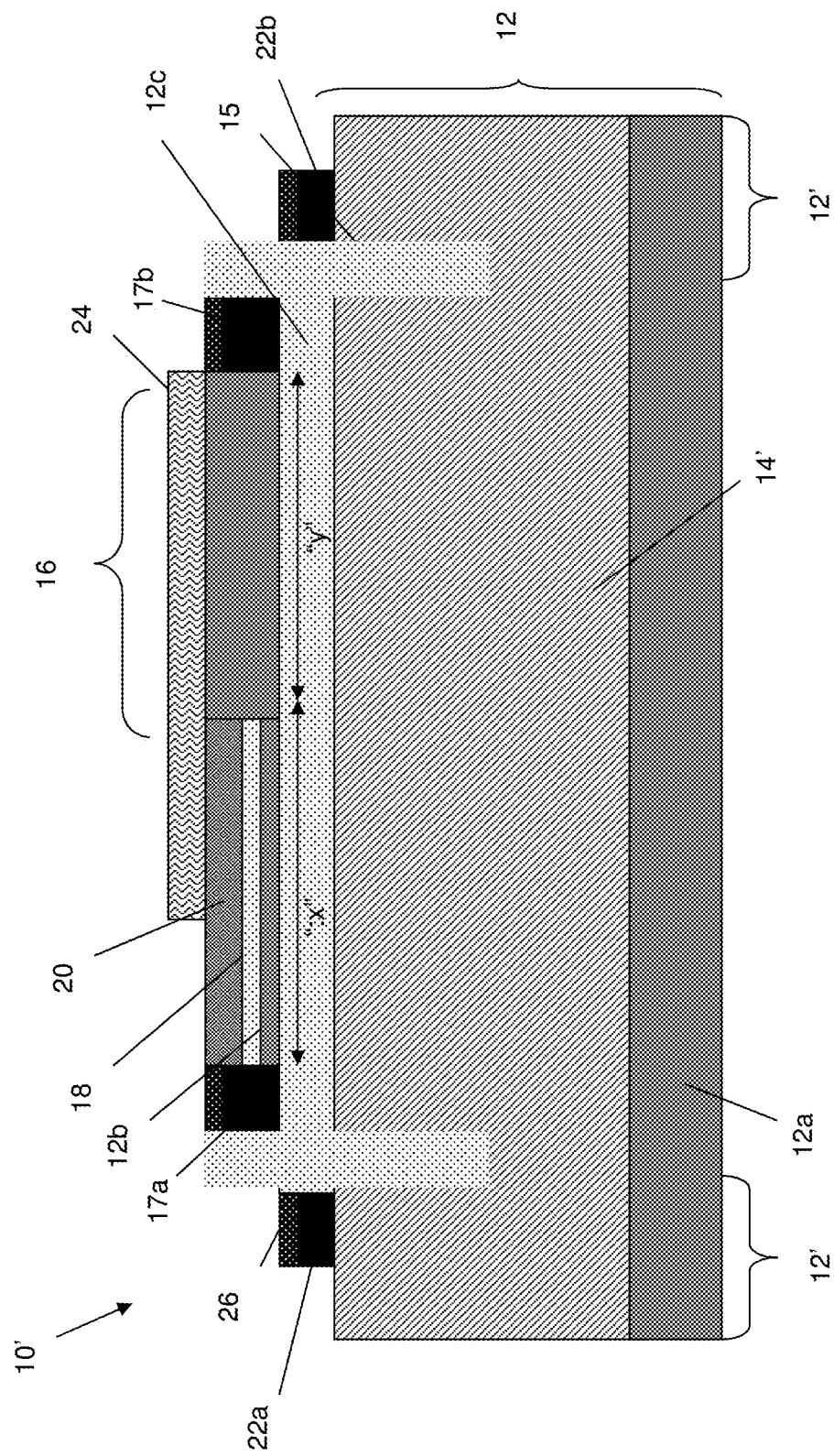
FIG. 2 shows a cross-sectional view of an FDSOI LDMOS structure with a P-well and respective fabrication processes in accordance with aspects of the present disclosure.

FIG. 2 shows a cross-sectional view of an FDSOI LDMOS structure 10' with a P-well 14' (under the channel comprising the layer 12b). In this embodiment, the gate contacts 22a, 22b are also P+ contacts. The remaining features are identical to the LDMOS structure 10 of FIG. 1, including the methods of fabrication. In embodiments, the gate terminal, e.g., gate contact 22b placed at the hybrid section 12' is used as a back-gate voltage to control the channel and the drift region of the device.

Figure 3:
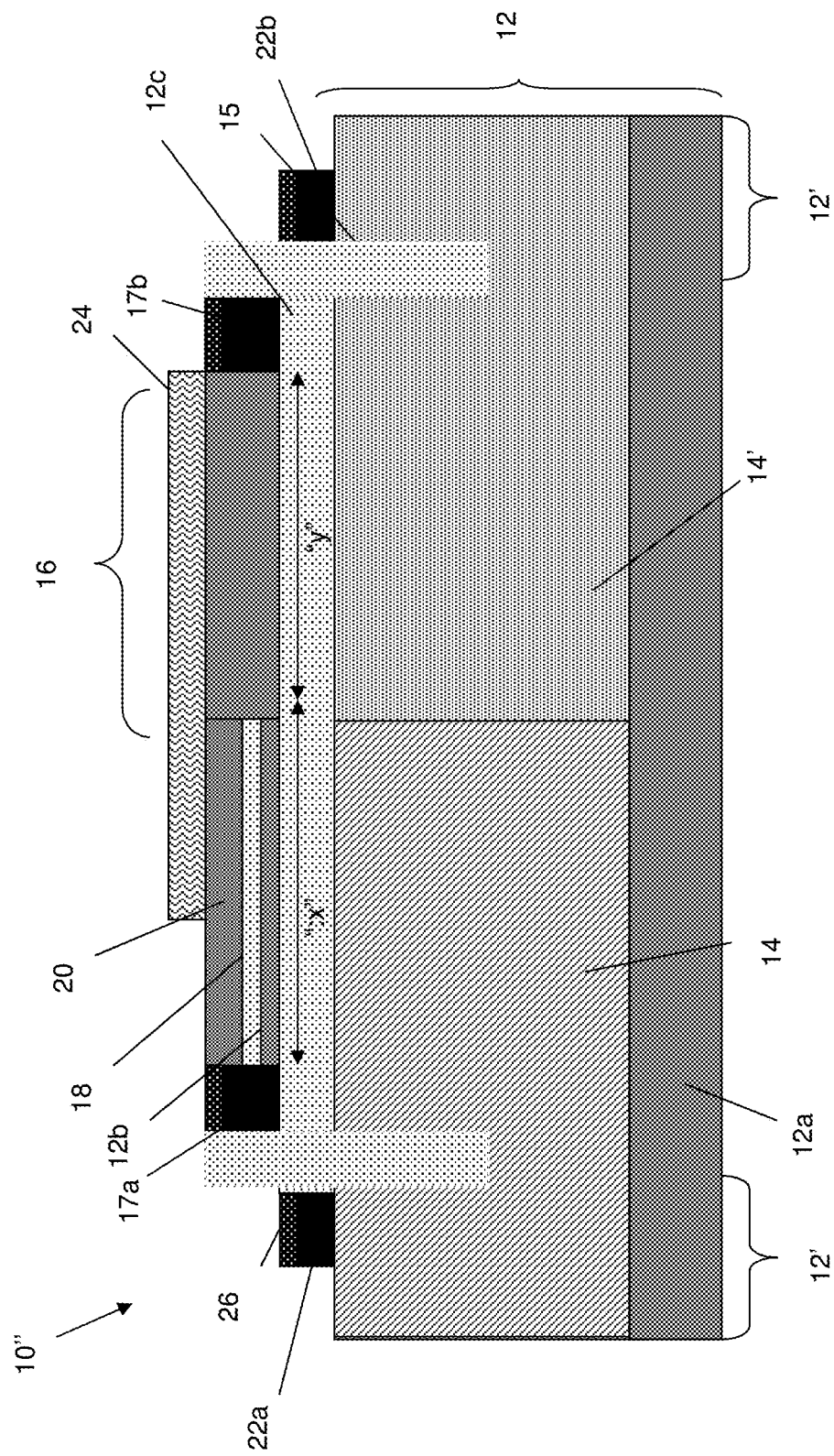
FIG. 3 shows a cross-sectional view of an FDSOI LDMOS structure with an N-well and P-well and respective fabrication processes in accordance with aspects of the present disclosure.

FIG. 3 shows cross-sectional view of an FDSOI LDMOS structure 10" with an N-well 14 and a P-well 14'. In this embodiment, the N-well 14 is on a source side of the device and the P-well 14' is on the drain side of the device. More specifically, the substrate 12 is split in N-type well 14 covering the SOI channel region and P-type well 14' covering the extended drain region 16. In addition, the gate contacts 22a, 22b are N+ contacts for the N-well 12 and P+ contacts for the P-well 14', respectively. As previously noted, the gate contacts 22a, 22b can be epitaxially grown material. The remaining features are identical to the LDMOS structure 10 of FIG. 1, including the methods of fabrication. Moreover, in operation, the gate can be independently biased with respect to the drift region. However, the P-well (under the drift region) bias should not be higher than the N-well bias in order to avoid PW-NW diode conduction. In embodiments, the gate terminal, e.g., gate contact 22b, placed at the hybrid section 12' is used as a back-gate voltage to control the channel and the drift region of the device. In this device, is should be noted that the Gate and the Drift region can be independently biased. Then, the contact 22a is for the gate control, and the contact 22b is for the drift control.

Figure 4:
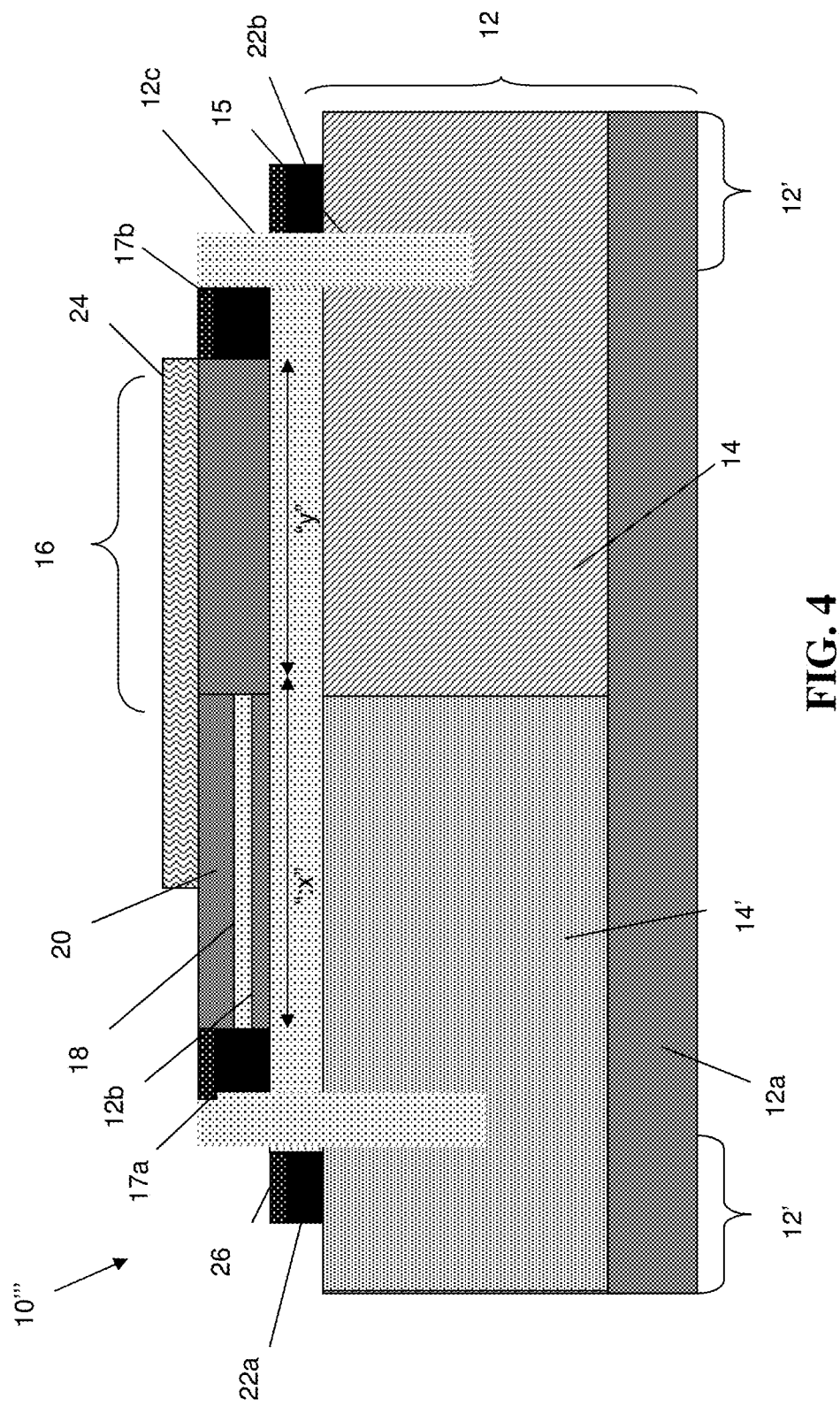
FIG. 4 shows a cross-sectional view of an alternative FDSOI LDMOS structure with an N-well and P-well and respective fabrication processes in accordance with aspects of the present disclosure.

FIG. 4 shows cross-sectional view of an FDSOI LDMOS structure 10''' with an N-well 14 and a P-well 14'. In this embodiment, the N-well 14 is on a drain side of the device and the P-well 14' is on the side source of the device. More specifically, the substrate 12 is split in N-type well 14 covering the extended drain region 16 and P-type well 14' covering the SOI channel region. In addition, the gate contacts 22a, 22b are P+ contacts for the P-well 14' and N+ contacts for the N-well 12, respectively. The remaining features are identical to the LDMOS structure 10 of FIG. 1, including the methods of fabrication. Moreover, in operation, the gate can be independently biased with respect to the drift region. However, the P-well (under the drift region) bias should not be higher than the N-well bias in order to avoid PW-NW diode conduction. In embodiments, the gate terminal, e.g., gate contact 22b, placed at the hybrid section 12' is used as a back-gate voltage to control the channel and the drift region of the device. Again, in this device, the Gate and the Drift region can be independently biased. Then, the contact 22a is for the gate control, and the contact 22b is for the drift control.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A laterally double diffused semiconductor device comprising a gate dielectric comprised of a buried insulator material of a semiconductor on insulator (SOI) technology, a channel region comprised of semiconductor material of the SOI technology and which is contacting the buried insulator material, a source region and a drain region on a front side of the buried insulator material such that a gate is formed on a back side of the buried insulator material, a gate oxide layer directly contacting the channel region, non-conductive spacer material contacting a top surface of the gate oxide layer, a contact of the source region contacting the buried insulator material, the semiconductor material of the channel region, the gate oxide layer and the non-conductive spacer material, and a contact of the drain region contacting the buried insulator material and the semiconductor material of the channel region, wherein:
   the semiconductor material of the channel region has a thickness different from semiconductor material of the drain region;
   a combined thickness of the semiconductor material of the channel region, the gate oxide layer and the non-conductive spacer material is equal to a thickness of the drain region such that a top surface of the spacer material and the drain region are planar; and
   the drain region contacts a side surface of the channel region, a side surface of the gate oxide layer, a side surface of the non-conductive spacer material and a top surface of the buried insulator material.

2. The laterally double diffused semiconductor device of claim 1, wherein the SOI technology is fully depleted SOI technology.

3. The laterally double diffused semiconductor device of claim 1, wherein the buried insulator material is buried oxide material with a thickness of about 20 nm.

4. The laterally double diffused semiconductor device of claim 1, wherein the drain region is an extended drain region and the semiconductor material of the drain region is comprised of doped epitaxially grown semiconductor material over the semiconductor material of the SOI technology.

5. The laterally double diffused semiconductor device of claim 4, wherein a gate length of the laterally double diffused semiconductor device is about 500 nm.

6. The laterally double diffused semiconductor device of claim 5, wherein the extended drain region is a drift region of about 150 nm in length.

7. The laterally double diffused semiconductor device of claim 6, further comprising a gate terminal placed at a hybrid section which is used as a back-gate voltage to control the channel region and the drift region.

8. The laterally double diffused semiconductor device of claim 4, wherein the buried insulator material sits over an N-well or a P-well.

9. The laterally double diffused semiconductor device of claim 4, wherein a substrate of the SOI technology is split into an N-well covering the channel region and a P-well covering the extended drain region.

10. The laterally double diffused semiconductor device of claim 4, wherein a substrate of the SOI technology is split into an N-well covering the extended drain region and a P-well covering the channel region.

11. The structure of claim 1, wherein:
the semiconductor material of the drain region is epitaxial semiconductor material directly on the semiconductor material of the SOI technology;
the spacer material is an insulator material extending between the contact of the source region and the epitaxial semiconductor material; and
gate contacts are on and above a surface of a substrate.

12. A structure comprising:
a substrate comprised of at least one well structure;
a buried oxide layer directly contacting and being on a top surface of the substrate, the buried oxide layer being a gate dielectric material of a transistor of a laterally double diffused semiconductor device;
a semiconductor on insulator material directly contacting on a top surface of the buried oxide layer, the semiconductor on insulator material being a channel region of the transistor;
an insulator material directly contacting a top surface of the semiconductor on insulator material over the channel region;
non-conductive spacer material directly contacting a top surface of the insulator material and directly contacting a drain region;
a source region and the drain region provided above the buried oxide layer, the drain region being comprised of semiconductor material over the semiconductor on insulator material;
a non-conductive mask contacting a top surface of the non-conductive spacer material and a top surface of the drain region; and
a source contact of the source region directly contacting the buried oxide layer, the semiconductor on insulator material of the channel region, the insulator material and the spacer material,
wherein a gate terminal placed at a hybrid section is used as a back-gate voltage to control the channel region and the drain region of the transistor,
wherein the drain region has a thicker semiconductor region than the channel region of the transistor,
the top surface of the drain region and the top surface of the non-conductive spacer material are a continuous planar surface, and
the non-conductive mask is on the continuous planar surface and extends from a drain contact to partially over the channel region.

13. The structure of claim 12, wherein the semiconductor on insulator material is fully depleted SOI technology.

14. The structure of claim 12, wherein the buried oxide layer has a thickness of about 20 nm.

15. The structure of claim 12, wherein the drain region is an extended drain region and the semiconductor material of the drain region is comprised of doped epitaxially grown semiconductor material over the semiconductor on insulator material and the gate terminal is placed adjacent to the extended drain region.

16. The structure of claim 15, wherein the extended drain region is a drift region of about 150 nm in length.

17. The structure of claim 15, wherein the substrate is SOI technology which is split into an N-well covering the extended drain region and a P-well covering the channel region.

18. The structure of claim 12, wherein the buried oxide layer sits over an N-well or a P-well.

19. The structure of claim 12, wherein the substrate is split into an N-well covering the channel region or the drain region and a P-well covering the other of the drain region or channel region.

20. The structure of claim 12, wherein
the semiconductor material over the semiconductor on insulator material is epitaxial semiconductor material directly on the semiconductor on insulator material;
the spacer material is a further insulator material extending between the source contact and the epitaxial semiconductor material;
a top surface of the semiconductor material over the semiconductor on insulator material is planar with the non-conductive spacer material; and
gate contacts are on and above a surface of the substrate.

\* \* \* \* \*